(12) United States Patent
Allen-Ware et al.

(10) Patent No.: US 9,310,424 B2
(45) Date of Patent: Apr. 12, 2016

(54) MONITORING AGING OF SILICON IN AN INTEGRATED CIRCUIT DEVICE

(71) Applicant: International Business Machines Corporation, Armonk, NY (US)

(72) Inventors: Malcolm S. Allen-Ware, Austin, TX (US); Ronald J. Bolam, East Fairfield, VT (US); Alan J. Drake, Round Rock, TX (US); Charles R. Lefurgy, Austin, TX (US); Barry P. Linder, Hastings-on-Hudson, NY (US); Steven W. Mittl, Essex, VT (US); Karthick Rajamani, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 558 days.

(21) Appl. No.: 13/775,502

(22) Filed: Feb. 25, 2013

(65) Prior Publication Data

US 2014/0244212 A1 Aug. 28, 2014

(51) Int. Cl.
*G06F 11/30* (2006.01)
*G01R 31/28* (2006.01)

(52) U.S. Cl.
CPC .................................. *G01R 31/2851* (2013.01)

(58) Field of Classification Search
CPC .................................................... G01R 31/2851
USPC ........................................................ 702/182
See application file for complete search history.

(56) References Cited

U.S. PATENT DOCUMENTS

| | | | |
|---|---|---|---|
| 4,719,587 A | 1/1988 | Berte |
| 4,816,753 A | 3/1989 | Palkuti |
| 5,059,903 A | 10/1991 | Otaka et al. |
| 5,608,845 A | 3/1997 | Ohtsuka et al. |
| 5,974,247 A | 10/1999 | Yonezawa |
| 6,922,597 B2 | 7/2005 | Mailliet et al. |
| 6,928,556 B2 | 8/2005 | Black et al. |
| 6,970,804 B2 | 11/2005 | Siegel et al. |
| 6,993,446 B2 | 1/2006 | Gunawardana et al. |
| 7,129,800 B2 | 10/2006 | Gauthier et al. |
| 7,146,292 B2 | 12/2006 | Rossi et al. |
| 7,262,753 B2 | 8/2007 | Tanghe et al. |
| 7,495,519 B2 | 2/2009 | Kim et al. |
| 7,769,568 B2 | 8/2010 | Marrano et al. |
| 8,024,148 B2 | 9/2011 | Petruno et al. |

(Continued)

OTHER PUBLICATIONS

Office Action dated Sep. 12, 2013 for U.S. Appl. No. 13/775,593, 12 pages.

(Continued)

*Primary Examiner* — Tung S Lau
*Assistant Examiner* — Xiuquin Sun
(74) *Attorney, Agent, or Firm* — Francis Lammes; Stephen J. Walder, Jr.; William J. Stock

(57) ABSTRACT

A mechanism is provided for determining a modeled age of a mufti-core processor. For each core in a set of cores in the multi-core processor, a determination is made of a temperature, a voltage, and a frequency at regular intervals for a set of degradations and a set of voltage domains, thereby forming the modeled age of the multi-core processor. A determination is made as to whether the modeled age of the multi-core processor is greater than an end-of-life value. Responsive to the modeled age of the multi-core processor being greater than an end-of-life value, an indication is sent that the multi-core processor requires replacement.

18 Claims, 4 Drawing Sheets

(56) References Cited

U.S. PATENT DOCUMENTS

| | | |
|---|---|---|
| 8,522,183 B1 | 8/2013 | McGuinness |
| 2002/0169580 A1 | 11/2002 | Lehoczky |
| 2004/0267395 A1 | 12/2004 | Discenzo et al. |
| 2005/0143956 A1 | 6/2005 | Long et al. |
| 2005/0151542 A1* | 7/2005 | Glockner ............ G01R 31/3173 324/543 |
| 2005/0246135 A1 | 11/2005 | Harn |
| 2006/0076971 A1 | 4/2006 | Krishnan et al. |
| 2007/0005527 A1 | 1/2007 | Parthasarathy |
| 2008/0027699 A1 | 1/2008 | Wu et al. |
| 2008/0038851 A1 | 2/2008 | Koyama et al. |
| 2009/0077508 A1 | 3/2009 | Rubin et al. |
| 2009/0094013 A1 | 4/2009 | Topaloglu et al. |
| 2009/0167336 A1 | 7/2009 | La Rosa et al. |
| 2009/0299716 A1 | 12/2009 | Liu et al. |
| 2010/0038683 A1 | 2/2010 | Shanware |
| 2010/0235110 A1 | 9/2010 | Wang et al. |
| 2010/0248046 A1 | 9/2010 | Kimura et al. |
| 2011/0010117 A1 | 1/2011 | Chen et al. |
| 2011/0054806 A1 | 3/2011 | Goldfine et al. |
| 2011/0173432 A1 | 7/2011 | Cher et al. |
| 2011/0202227 A1 | 8/2011 | Zhang et al. |
| 2011/0257954 A1 | 10/2011 | Soni et al. |
| 2011/0285401 A1 | 11/2011 | Arnaud |
| 2011/0301871 A1 | 12/2011 | Budiscak et al. |
| 2011/0313735 A1 | 12/2011 | Lo et al. |
| 2012/0152007 A1 | 6/2012 | Holmes et al. |
| 2012/0290241 A1 | 11/2012 | Nguyen et al. |
| 2013/0090900 A1 | 4/2013 | Gering |

OTHER PUBLICATIONS

Response to Office Action filed Dec. 5, 2013, U.S. Appl. No. 13/775,593, 29 pages.

U.S. Appl. No. 13/775,593.

"Performance Tuning Protection Plan by Intel", Intel Corporation, http://click.intel.com/tuningplan/, retrieved Aug. 7, 2012, 1 page.

Mintarno, Evelyn et al., "Self-Tuning for Maximized Lifetime Energy-Efficiency in the Presence of Circuit Aging", IEEE Transactions on Computer-Aided Design of Integrated Circuits and Systems, 30(5), May 2011, pp. 760-773.

Notice of Allowance mailed Dec. 16, 2013 for U.S. Appl. No. 13/775,593, 8 pages.

\* cited by examiner

MONITORING AGING OF SILICON IN AN INTEGRATED CIRCUIT DEVICE

BACKGROUND

The present application relates generally to an improved data processing apparatus and method and more specifically to mechanisms for monitoring and managing the aging of silicon in an integrated circuit device.

Integrated circuit designers plan for the aging or power-on hours (POH) of silicon in integrated circuit devices based on modeling various degradations to the silicon with degradation dependent on, for example, unique characteristics that arise from manufacturing, such as effective gate conductor length (Lpoly) of critical circuits for a given chip or wafer (L) and a magnitude coefficient that varies by wafer or lot (A), and run-time operational characteristics experienced by the silicon, such as junction temperature (T), frequency of operation (F), which is often augmented by a generic switching factor assumption (FR), and voltage of operation (Vds).

An estimated lifetime of the silicon assumes a static 'worst case' combination of design characteristics and conditions of operation. However, most shipped integrated circuit devices will never hit this POH limit. Therefore, operating integrated circuit devices under 'worst case' scenarios may result in very conservative (high energy inefficient) voltages, operating frequencies, required cooling, or the like, in the design for most components within such integrated circuit devices. Further, other integrated circuit devices may be erroneously discarded when their determined effective gate conductor length (Lpoly) of critical circuits for a given chip or wafer (L) and/or a magnitude coefficient that varies by wafer or lot (A) lead to unacceptable POH based on the 'worst case' scenarios of static assumptions on operational characteristics.

SUMMARY

In one illustrative embodiment, a method, in a data processing system, is provided for determining a modeled age of a multi-core processor. For each core in a set of cores in the multi-core processor, the illustrative embodiment determines a temperature, a voltage, and a frequency at regular intervals for a set of degradations and a set of voltage domains, thereby forming the modeled age of the multi-core processor. The illustrative embodiment determines whether the modeled age of the multi-core processor is greater than an end-of-life value. The illustrative embodiment sends an indication that the multi-core processor requires replacement in response to the modeled age of the multi-core processor being greater than an end-of-life value.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide monitoring and managing the aging of silicon in an integrated circuit device. Again, current estimates for the aging of silicon within integrated circuit devices assume a static 'worst case' combination of design characteristics and conditions of operation. The illustrative embodiments provide for the adoption of more aggressive operational parameters through the monitoring and mitigation of the aging of silicon. That is, the illustrative embodiments utilize modeling equations to evaluate various forms of silicon aging and/or degradation in real-time. Utilizing critical and measurable run-time operational parameters as input, such as voltage, frequency, temperature, switching, workloads, or the like on a fine time scale, the illustrative embodiments compute M degradations times P voltage domains (M*P) reference ages of N cores in a multi-core processor in real-time. The illustrative embodiments then implement one or more actions to manage the aging of the silicon that avoid early mortality of the silicon and improve the effective lifetime of the system. Further, once any of the M*P*N reference ages for the multi-core processor pass a predefined threshold associated with M degradations, P voltage domains, and N cores in a multi-core processor, respectively, the illustrative embodiments provide indications that the integrated circuit device should be replaced.

Figure 1:
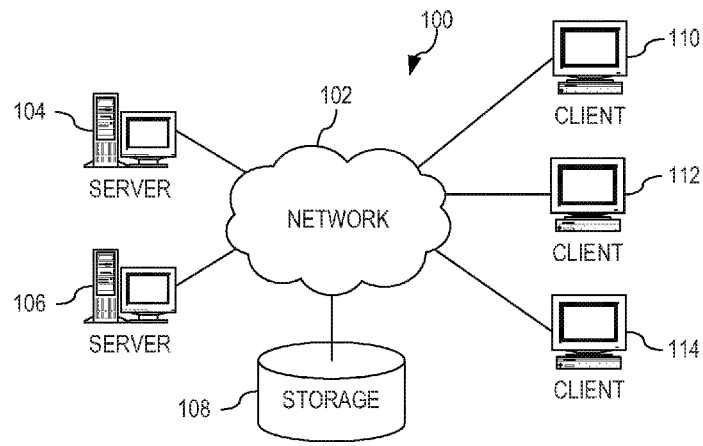
FIG. 1 is an example diagram of a distributed data processing system in which aspects of the illustrative embodiments may be implemented.
Figure 2:
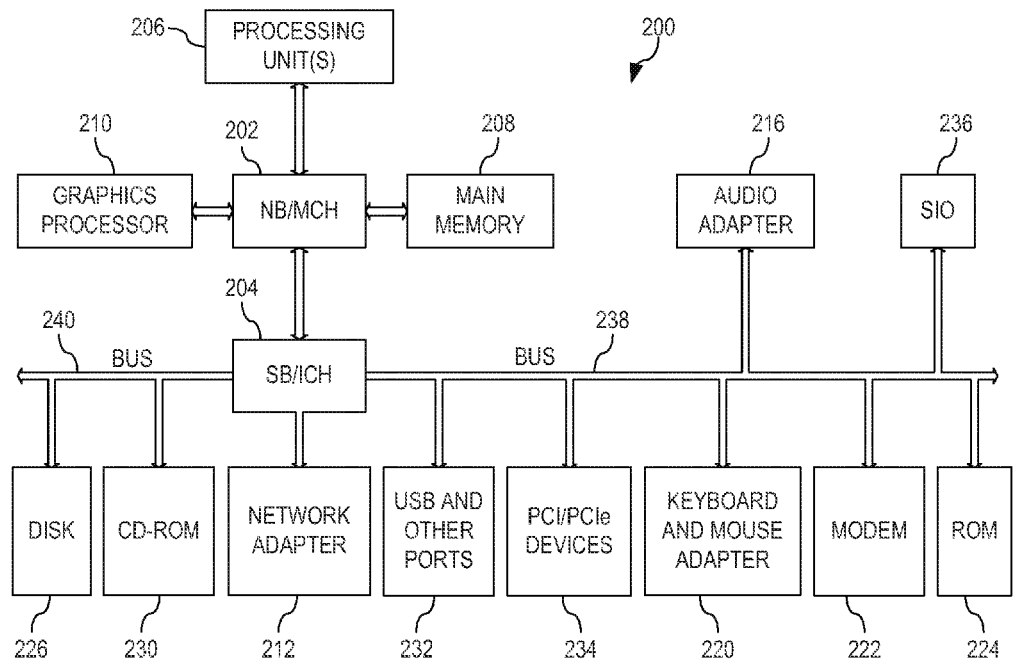
FIG. 2 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented.

Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational, and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, white PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be for example, an IBM® eServer™ System P® computer system, running the Advanced Interactive Executive (AIX®) operating system or the LINUX® operating system. Data processing system 200 may be a symmetric multiprocessor (SNIP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

Figure 3:
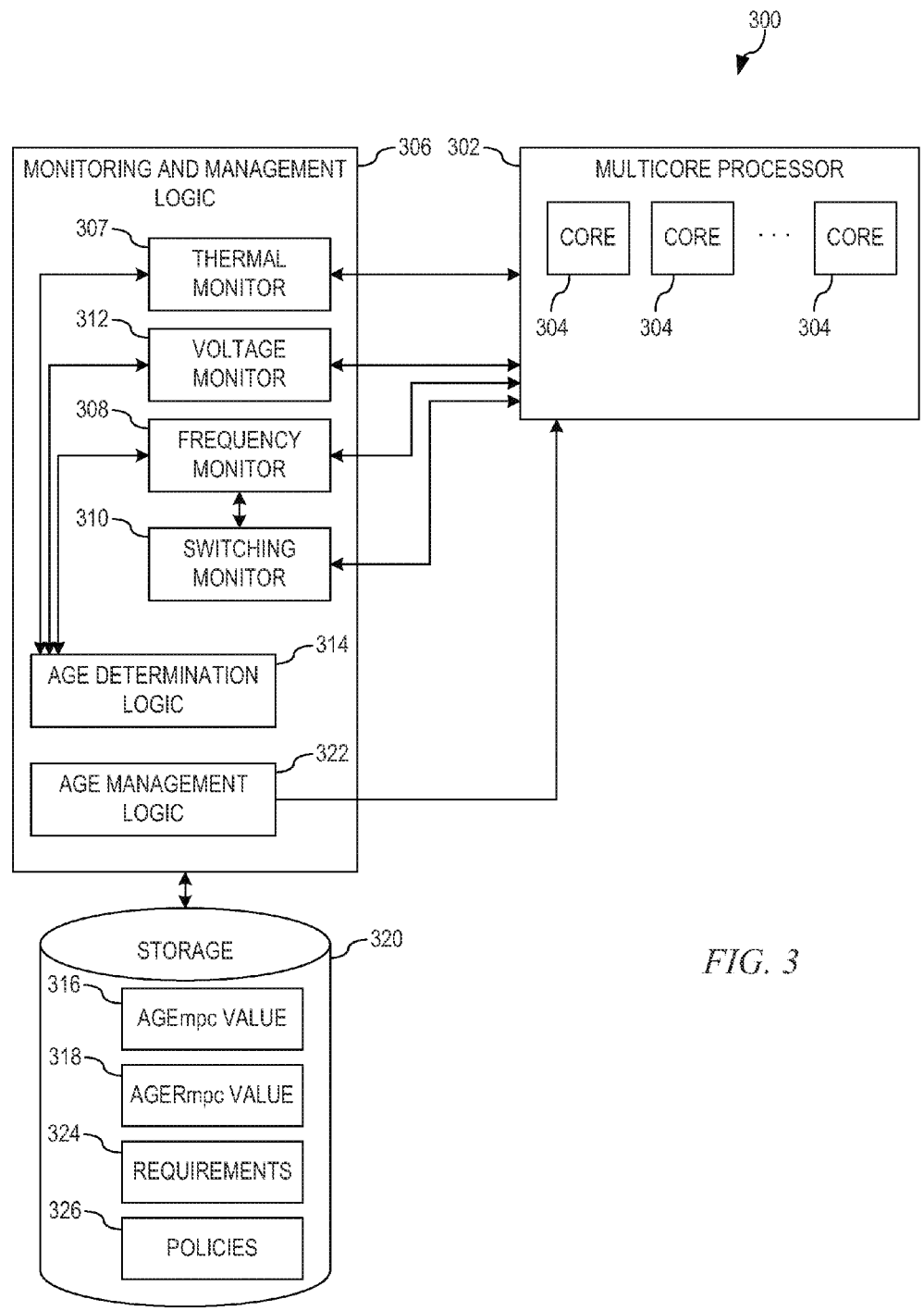
FIG. 3 depicts a functional block diagram of a mechanism for monitoring and managing run-time parameters of an integrated circuit device in accordance with an illustrative embodiment.

Again, the illustrative embodiments utilize critical and measurable run-time operational parameters as input, such as voltage, frequency, temperature, switching, workloads, or the like on a fine time scale, to adopt more aggressive operational parameters for integrated circuit devices through monitoring and managing the aging of silicon in the integrated circuit devices. FIG. 3 depicts a functional block diagram of a mechanism for monitoring and managing run-time parameters of an integrated circuit device in accordance with an illustrative embodiment. Data processing system 300 comprises one or more multi-core processor 302 with each processor being comprised of one or more cores 304. For each core 304 in each multi-core processor 302, monitoring and management logic 306 measures run-time operational characteristics experienced by the silicon of core 304 with high precision. For example, for each core 304 in each multi-core processor 302, thermal monitoring logic 307 measure junction temperatures (T) with a +/−1% measurement error in degrees Kelvin at host spots in core 304. While the current example uses Kelvin as the basis for temperature measurement, the illustrative embodiments are not limited to using only temperature measurements in Kelvin. That is, any unit of measurement for temperature may be used, such as Fahrenheit, Celsius, or the like.

For each core 304 in multi-core processor 302, frequency monitoring logic 308 measures operational frequencies (F) via switching with a +/−0.05% measurement error in megahertz (MHz) on an upper bound even with active Dynamic Voltage and Frequency Scaling (DVFS). Furthermore, frequency monitoring logic 308 may augment the operation frequencies (F) via switching monitoring logic 310 that utilizes digital power proxies to weight the measured frequencies based on a predetermined importance of various components within core 304, thereby avoiding generic frequency values. Additionally, for each core 304 in each multi-core processor 302, voltage monitoring logic 312 measures operation voltages (Vds) with +/−1% measurement error in volts on an upper bound (i.e., regulator setting) even with active Dynamic Voltage and Frequency Scaling (DVFS).

The measurements performed by thermal monitoring logic 307, frequency monitoring logic 308 with or without switching monitoring logic 310, and voltage monitoring logic 312 are then utilized by age determination logic 314 in determining a real-time age of core 304. Beginning at initialization of data processing system 300, age determination logic 314 determines a number of degradations (M), a number of voltage domains (P), and a number of cores (C) in data processing system 300.

With regard to the number of voltage domains (P), in currently known data processing systems, such as data processing system 300, there are usually two if not many more voltage domains. Thus, age determination logic 314 determines an age based on each of the utilized voltage domains within data processing system 300. With regard to the degradations in the number of degradations (M), these degradations may be for transistor threshold voltage (Vt), sub-threshold slope (SS), transconductance (gm), or the like, which degrade in a continuous fashion, such as negative bias temperature instability (NBTI), positive bias temperature instability (PBTI), hot carrier injection (HCI), stress induced leakage current (SILC), time dependent dielectric breakdown (TDDB), (PCCA), or the like. PCCA refer to the PC and CA layers in our processing mask step. PC is the metal used to form transistor gates and CA is the metal used to connect wiring metal layers to the PC gate metal and to the transistor source and drain. There is a special degradation at these levels of the dielectric that isolates wires, gates, connection vias, or the like. While age determination logic 314 may determine the number of voltage domains (P) through an analysis of data processing system 300, age determination logic 314 determines the number of degradations (M) through a predefined list of degradations. Age determination logic 314 tracks each degradation in the number of degradations (M) independently over the life time of the silicon as well as treats each degradation in the number of degradations (M) independently. During every interval (t), age determination logic 314 selects whichever degradation is currently showing the most aging for the input to the action to be taken to address the aging of core 304. Over the lifetime of core 304, age determination logic 314 may identify a reduction in the number of degradations (M) to track for a given product family if specific degradations are seen as uninteresting when compared to others by an administrator. That is, the administrator may reduce the predefined list of degradations based on results provided by age determination logic 314.

Once age determination logic 314 determines the number of degradations (M), the number of voltage domains (P), and the number of cores (C), age determination logic 314 sets incrementing variables for degradations (m), voltage domains (p), and cores (c) to 1. For each combination of degradations in the number of degradations (M), voltage domains in the number of voltage domains (P), and cores in the number of cores (C), age determination logic 314 also sets a set of modeled age variables AGEmpc equal to 0 and a set of reference modeled age variables AGERmpc to 0. The modeled age variable AGEmpc measures the modeled age of the actual silicon in microseconds, which is updated every interval (t). The reference modeled age variable AGERmpc measures the reference modeled age of silicon in microseconds, which is also updated every interval (t). Thus, for example, if there are three degradations, two voltage domains, and two cores, there would be 12 unique AGEmpc values (AGE111, AGE211, AGE311, AGE121, AGE221, AGE321, AGE112, AGE212, AGE312, AGE122, AGE222, and AGE322). Likewise, there would also be 12 unique AGERmpc values (AGER111, AGER211, AGER311, AGER121, AGER221, AGER321, AGER112, AGER212, AGER312, AGER122, AGER222, and AGER322). Therefore, for each combination of degradation, voltage domain, and core, the corresponding AGEmpc value and AGERmpc value are maintained independently and distinctly without ever being intermixed.

With these variables set, for each combination of degradation, voltage domain, and core during every interval (t), which is a predetermined time period, and for a current core in cores 304, age determination logic 314 receives measurements from thermal monitoring logic 306, frequency monitoring logic 308 with or without switching monitoring logic 310, and voltage monitoring logic 312, resulting in a temperature for the current voltage domain (Tp), a frequency for the current voltage domain (Fp), and a voltage for the current voltage domain (Vp). In accordance with the illustrative embodiments, age determination logic 314 may utilize either a peak value during the interval (t) or an average value during the interval (t) for each of temperature (Tp), frequency (Fp), and voltage (Vp).

With these values, age determination logic 314 computes a time at a reference condition ($t_{ref}$) value for each type of degradation. For example, with regard to a hot carrier shift (HCI) degradation, age determination logic 314 computes a time at a reference condition ($t_{ref}$) value utilizing the following equation:

$$t_{ref} = t \times \left(\frac{Fp}{F_{ref}}\right) \times C \times e^{B'(V_p - V_{ref}) + E'\left(\frac{1}{T_p} - \frac{1}{T_{ref}}\right)}$$

where $F_{ref}$ is a predetermined reference frequency, $V_{ref}$ is a predetermined reference voltage, and $T_{ref}$ is a predetermined reference temperature, which are all typically set to some previous experimental condition. C, B', and E' are fitting constants that are determined experimentally and are unique to a given technology. C, B', and E' are calculated externally to save time internally.

For a negative bias temperature instability (Nan) or positive bias temperature instability (PBTI) degradation, age determination logic 314 computes a time at a reference condition ($t_{ref}$) value utilizing the following equation:

$$t_{ref} = t \times \left(\frac{A}{A_{ref}}\right)^{\frac{1}{n}} \times e^{\frac{B}{n}(V_p - V_{ref})} \times e^{\frac{E_a}{nk}\left(\frac{1}{T_p} - \frac{1}{T_{ref}}\right)}$$

where A is a characteristic magnitude of the specific chip, wafer, or lot as measured by inline stress, $A_{ref}$ is a characteristic magnitude constant at the reference conditions from a bias temperature instability (BTI) model, n is a time slope constant from the BTI model, B is a voltage dependence constant from the BTI model, $V_p$ is a voltage applied during a current interval (t), $V_{ref}$ is a reference voltage, $E_a$ is an activation energy constant from time dependent dielectric breakdown (TDDB) models, $T_p$ is a silicon temperature (degrees K) during the current interval, and $T_{ref}$ is a reference temperature (degrees K).

For a time dependent dielectric breakdown (TDDB) degradation, age determination logic 314 computes a time at a reference condition ($t_{ref}$) value utilizing the following equation:

$$t_{ref} = t \times \left(\frac{t_{63ref}}{t_{63}}\right) \times 10^{\left(\frac{t_{oxref} - t_{ox}}{t_{oxscale}}\right)} \times \left(\frac{V_p}{V_{ref}}\right)^n \times e^{\frac{E_a}{nk}\left(\frac{1}{T_p} - \frac{1}{T_{ref}}\right)}$$

where $t_{63ref}$ is a characteristic lifetime constant at the reference conditions from TDDB models, $t_{63}$ is a characteristic lifetime of the specific chip, wafer or lot as measured by inline stress, $t_{oxref}$ is a nominal technology oxide thickness (constant), $t_{ox}$ is and oxide thickness of the specific chip, wafer, or lot as measured by inline test, $t_{oxscale}$ is an oxide thickness dependence factor constant (Angstroms/decade) from TDDB models, $V_p$ is a voltage applied during the current interval, $V_{ref}$ is a reference voltage, n is a voltage dependence constant from TDDB models, $E_a$ is an activation energy constant from TDDB models, $T_p$ is a silicon temperature (degrees K) during the current interval, and $T_{ref}$ is a reference temperature (degrees K). For a PCCA (gate and contact) time dependent dielectric breakdown (TDDB) degradation, age determination logic 314 computes a time at a reference condition ($t_{ref}$) value utilizing the following equation:

$$t_{ref} = t \times e^{[\gamma(\sqrt{V_p} - \sqrt{V_{ref}})]} \times e^{\frac{E_a}{nk}\left(\frac{1}{T_p} - \frac{1}{T_{ref}}\right)}$$

where $\gamma$ is a voltage dependence constant from PCCA models, $V_p$, is a voltage applied during the current interval (t), $V_{ref}$ is a reference voltage, $E_a$ is an activation energy constant from TDDB models, $T_p$ is a silicon temperature (degrees K) during the current interval, and $T_{ref}$ is a reference temperature (degrees K).

While the illustrative embodiments provide examples of age determination logic 314 determining the time at the reference condition ($t_{ref}$) for various degradations, the illustrative embodiments are not limited to only these examples. That is, the illustrative embodiments recognize that there are other calculations that may be performed for other types of degradation in order for age determination logic to identify the time at the reference condition ($t_{ref}$) for each type of degradation.

With the time at a reference condition ($t_{ref}$) determined, age determination logic 314 increases modeled age variable AGEmpc value 316 in storage 320 for the core by adding the $t_{ref}$ value to the current modeled age variable AGEmpc value as follows:

AGEmpc=AGEmpc+$t_{ref}$(m,p,c).

Age determination logic 314 also increases reference modeled age variable AGERmpc value 318 in storage 320 for the core by adding the interval (t) to the current reference modeled age variable AGERmpc value as follows:

AGERmpc=AGERmpc+t.

Age determination logic 314 then increases the degradation variable m by 1 as follows:

m=m+1, to evaluate a model equation for the next degradation. Age determination logic 314 then determines whether the current value of the degradation variable m is greater than the number of degradations (M).

If age determination logic 314 determines that the current value of the degradation variable in is less than or equal to the number of degradations (M), then age determination logic 314 computes a new time at a reference condition ($t_{ref}$) for a newly measured temperature for the current voltage domain (Tp), frequency for the current voltage domain (Fp), and a voltage for the current voltage domain (Vp). Age determination logic 314 then repeats the process for each of the number of degradations (M). If age determination logic 314 determines that the current value of the degradation variable in is greater than the number of degradations (M), then age determination logic 314 increases the voltage domain variable p by 1 as follows:

p=p+1, which moves to evaluate all degradations associated with the next voltage domain. Age determination logic 314 then determines whether the current value of the voltage domain variable p is greater than the number of voltage domains (P). If age determination logic 314 determines that the current value of the voltage domain variable p is less than or equal to the number of voltage domains (P), then age determination logic 314 sets the degradation variable in equal to 1 and computes a new time at a reference condition ($t_{ref}$) for a newly measured temperature for the current voltage domain (Tp), frequency for the current voltage domain (Fp), and a voltage for the current voltage domain (Vp). Age determination logic 314 then repeats the process for the next voltage domain in the number of voltage domains (P) and for each of the number of degradations (M).

If age determination logic 314 determines that the current value of the voltage domain variable p is greater than the number of voltage domains (P), then age determination logic 314 increases the core variable c by 1 as follows:

c=c+1, which changes to the next modeled core's degradations. Age determination logic 314 then determines whether the current value of the core variable c is greater than the number of cores (C). If age determination logic 314 determines that the current value of the core variable c is less than or equal to the number of cores (C), then age determination logic 314 sets the voltage domain variable p equal to 1, sets the degradation variable in equal to 1, and computes a new time at a reference condition ($t_{ref}$), thereby repeating the process for the next core in the number of cores (C), for each of the number of voltage domains (P) and for each of the number of degradations (M).

If age determination logic 314 determines that the current value of the core variable c is greater than the number of cores (C), then age determination logic 314 determines whether the maximum of the modeled age variable AGEmpc values for the cores 304 on multi-core processor 302 is greater than an end-of-life value for the cores 304 on multi-core processor 302 minus an epsilon value. That is, the manufacturer of multi-core processor 302 provides an end-of-life value for the cores 304 on multi-core processor 302. Additionally, enterprises provide a maintenance time frame (epsilon) for replacement of components within a data processing system, such as data processing system 300. Thus, age determination logic 314 determines whether the maximum of the modeled age variable AGEmpc values for the cores 304 on multi-core processor 302 is greater than an end-of-life value for the cores 304 on multi-core processor 302 minus the epsilon value.

If age determination logic 314 determines that the maximum of the modeled age variable AGEmpc values for the cores 304 on multi-core processor 302 is less than or equal to the end-of-life value for the cores 304 on multi-core processor 302 minus the epsilon value, then age determination logic 314 waits one interval t and then sets the voltage domain variable p equal to 1, sets the degradation variable equal to 1, and sets the core variable c equal to 1. Age determination logic 314 then starts the process over for each core in the number of cores (C), for each of the number of voltage domains (P) and for each of the number of degradations (M) until the maximum of the modeled age variable AGEmpc values for the cores 304 on multi-core processor 302 is greater than the end-of-life value for the cores 304 on multi-core processor 302 minus the epsilon value. Once age determination logic 314 determines that the maximum of the modeled age variable AGEmpc values for the cores 304 on multi-core processor 302 is greater than the end-of-life value for the cores 304 on multi-core processor 302 minus the epsilon value, age determination logic 314 sends an indication to an administrator that the multi-core processor requires replacing.

Thus, age determination logic 314 provides accurate monitoring of the current modeled age of multi-core processor 302 within data processing system 300 via modeled age variable AGEmpc. However, as is illustrated, the current modeled age is dependent on the measured temperature (T), the measured frequency (F) and the measured voltage (P) for each core, voltage domain, and degradation. Accordingly, one of ordinary skill in the art can see that the age of multi-core processor 302 may be shortened or lengthened based on the utilized temperatures, frequencies, and/or voltages.

Therefore, the illustrative embodiments also provide for managing the aging of silicon in an integrated circuit device by providing age management logic 322. For each of cores 304 in multi-core processor 302 and/or processing system 300 as a whole, age management logic 322 determines one or more of an operating voltage, an operating frequency, workload, power cap, or the like for each of cores 304 or a cooling fan speed for data processing system 300. Age management logic 322 makes these determinations based on the modeled age variable AGEmpc value 316 for each core and reference modeled age variable AGERmpc value 318 for each core as determined above as well as any predetermined desired power, performance, and/or aging requirements 324.

Desired power, performance, and/or aging requirements 324 may be part of a static utility function set for data processing system 300 that defines an optimal performance of data processing system 300, a maximum power usage of data processing system 300, and an estimated age of data processing system 300. However, desired power, performance, and/or aging requirements 324 may also be part of a dynamic utility function set for data processing system 300 where the power usage, performance, and age of the data processing system are controlled via user input. The utility function captures the optimization criteria or desired trade-offs between power usage, performance and aging of the data processing system. This trade-off can further be dynamically changed based on user needs and the change communicated as a new utility function to the age management system. That is, current data processing systems allow users to select operating modes that have an associated performance and power usage. Further, current data processing systems may also allow users to select a desired performance or power usage. In accordance with the illustrative embodiments, a user may not only select an operating mode, a performance level, and/or power usage, but the user may also select an age that the user wants the data processing system to meet. However, the illustrative embodiment recognizes that, in order to lengthen the age of data processing system 300, performance may be lost. Likewise, if more performance is desired, then some age will be lost and power usage will be increased. Therefore, the illustrative embodiments provide the user with feedback as to the increases and decreases in performance, power usage, and age, based upon the selections made by the user.

With the modeled age variable AGEmpc values 316, reference modeled age variable AGERmpc values 318, and predetermined desired power, performance, and/or aging requirements 324 identified, age management logic 322 determines, for example, whether a core is aging faster than the desired aging requirement. That is, in data processing system 300, one core may process more workload than the other cores, one core may operate at a faster frequency then another core, one core may operate at a higher voltage than another core, etc. Therefore, age management logic 322 determines, for each core, whether the current modeled age variable AGEmpc value 316 indicates that the core is aging at a rate that is faster than the desired aging requirement. For example, if the desired aging requirement is to get 8 years of life out of core, data processing system has been in operation for 4 years and 1 month (AGERmpc), and the current modeled age variable AGEmpc value for the core indicates an age of 4 years and 6 months, then age management logic 322 identifies that the core has an negative age difference of 5 months over the desired aging requirement.

Further, in addition to or as an alternative to age management logic 322 determining, for each component, whether the current modeled age variable AGEmpc value 316 indicates that the component is aging at a rate that is faster than the desired aging requirement, age management logic 322 may also determine a rate of aging and whether the rate of aging is greater than a desired rate of aging requirement. In order to determine a rate of aging, age management logic 322 records a first current modeled age (AGEmpc) and a first reference modeled age (AGERmpc) at time T1. Then, at a later time, age management logic 322 records a second current modeled age (AGEmpc) and a second reference modeled age (AGERmpc) at time T2. Age management logic 322 then computes the rate of aging (rateofaging) by utilizing the following equation:

$$rateofaging = \frac{AGEmpc_{T2} - AGEmpc_{T1}}{AGERmpc_{T2} - AGERmpc_{T1}}$$

Again, the current modeled age (AGEmpc) is dependent on the measured temperature (T), the measured frequency (F) and the measured voltage (P) for each core, voltage domain, and degradation. This age management logic 322 may implement one or more corrective actions to mitigate the aging of the core in order to meet the desired aging requirements and/or to mitigate the rate of aging in order to meet the rate of aging requirements, based on a selected policy from a set of predefined policies 326. For example, age management logic 322 may:

Reduce voltage increases for a given performance, which permits that performance only for workloads that allow some amount of undervolting and not for workloads that allow no undervolting.

Reduce the extent of allowed frequency range increase for a desired power-performance mode. This may also limit frequency range based on extent of undervolting, such as, if increase in frequency is balanced by allowed decrease in voltage aging, then permit frequency increase.

Change temperature thresholds at which cooling actions are triggered.

Allow frequency/voltage increases only if the net utility of doing so exceeds a certain threshold where the net utility could be defined, for example, as the ratio of frequency increase to age increase to limit the maximum age increase allowed for a given frequency increase. The net utility may be defined as a function U of the form K*(freq2−freq1)/(age2−age1) where freq1 and age1 are current values of core frequency and AGEmpc and where age2 is an expected AGEmpc after an elapsed time (AGERmpc) of T running at freq2, which is some value greater than freq1. Then, increasing the operating frequency to freq2 may be allowed only if U is greater than a predetermined net utility threshold. The utility function, U, in general could be any function relating operations characteristics such as frequency, voltage or temperature to age, or performance and power to age.

When enforcing a system power cap, power cap aged core first.

Change workload scheduling and usage models to slow down aging of aged core, thereby improve uniformity of aging of core and maximizing slowdown of overall aging.

Change computation model (use different algorithm) to utilize "younger" components, thereby spreading aging effects.

Combine silicon aging metrics for CMOS-based components with other aging criteria for other components extending the silicon age mitigation approach to address both silicon and non-silicon aspects of computer system/components aging.

Choose a hierarchy for computation based on ages of the components at each level.

Thus, if one core is aging faster than another core, age management logic 322 may modify the power management parameters i.e., voltage, frequency, fan speed, workload, scheduling, computational models, hierarchies, or the like) of the core, the processor, and/or the data processing system to uniformly age each of cores 304 in order to meet the desired aging requirements and/or the rate of aging requirements.

As stated previously, age management logic 322 utilizes a selected policy from a set of predefined policies 326 to determine which power management control parameters to change for a determined aging condition. Each of the set of predefined policies 326 may be identified by a desired performance, a desired power usage, a desired aging, a negative age difference, or the like. Therefore, based on the desired power, performance, and/or aging requirements 324, the current modeled age variable AGEmpc value 316, the current reference modeled age variable AGERmpc value, and the determined negative age difference, age management logic 322 may identify one or more policies from a set of predefined policies 326. If age management logic 322 identifies more than one policy, then age management logic 322 may select one policy to implement either randomly, by predetermined priority, or the like, with the knowledge that the policy may change after a redetermination after a predetermined time period. That is, age management logic 322 may select and implement one policy and allow the power management control parameters associated with that policy to take effect. Then, after the predetermined time period has expired, age management logic 322 may repeat the process to determine whether the negative age difference has been reduced. If the negative age difference is being reduced by the implementation of the policy, then age management logic 322 may take no further action and leave the policy in place. However, if age management logic 322 determines that the implemented policy is worsening the negative age difference or not having any effect, then age management logic 322 may implement a new policy. Further, if age management logic 322 determines that the implementation of the policy has negated the negative age difference, then age management logic 322 may implement a new policy that accounts for desired power, performance, and/or aging requirements 324 without any negative age difference.

While the illustrative embodiments are described with respect to core aging, one of ordinary skill in the art that the age determination and meeting aging requirements may be applied to almost any component of data processing system 300, such as processors, memory, I/O units, or the like. Thus, age management logic 322 may also implement different policies for different components. For example, if a memory has a negative age difference, then age management logic 322 may choose a policy that stores less and computes more by using, for example, memory compression to reduce amount of memory used and number of memory system accesses.

Thus, the illustrative embodiments identify whether silicon of components within a data processing system have been pushed to pre-mature aging through aggressive performance usage and provide for the mitigation of premature aging through power management control parameters. By identifying premature aging of components, higher performance levels may be offered while informing the user of the aging tradeoffs. Additionally, aging may be improved during times when the user does not require the higher performance levels. That is, data processing systems may be operated at less conservative operating points (and consequently at higher performance/efficiencies) by default knowing that an aging control mechanism is built in. Thus, reliability of data processing system is improved with an increase in technology scaling and associated variability and uncertainties. For extremely large data processing systems, the illustrative embodiments provide for a component-by-component identification that allows for predictive replacement periods for components that are close to end of life.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system," Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROW, an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the tatter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 4:
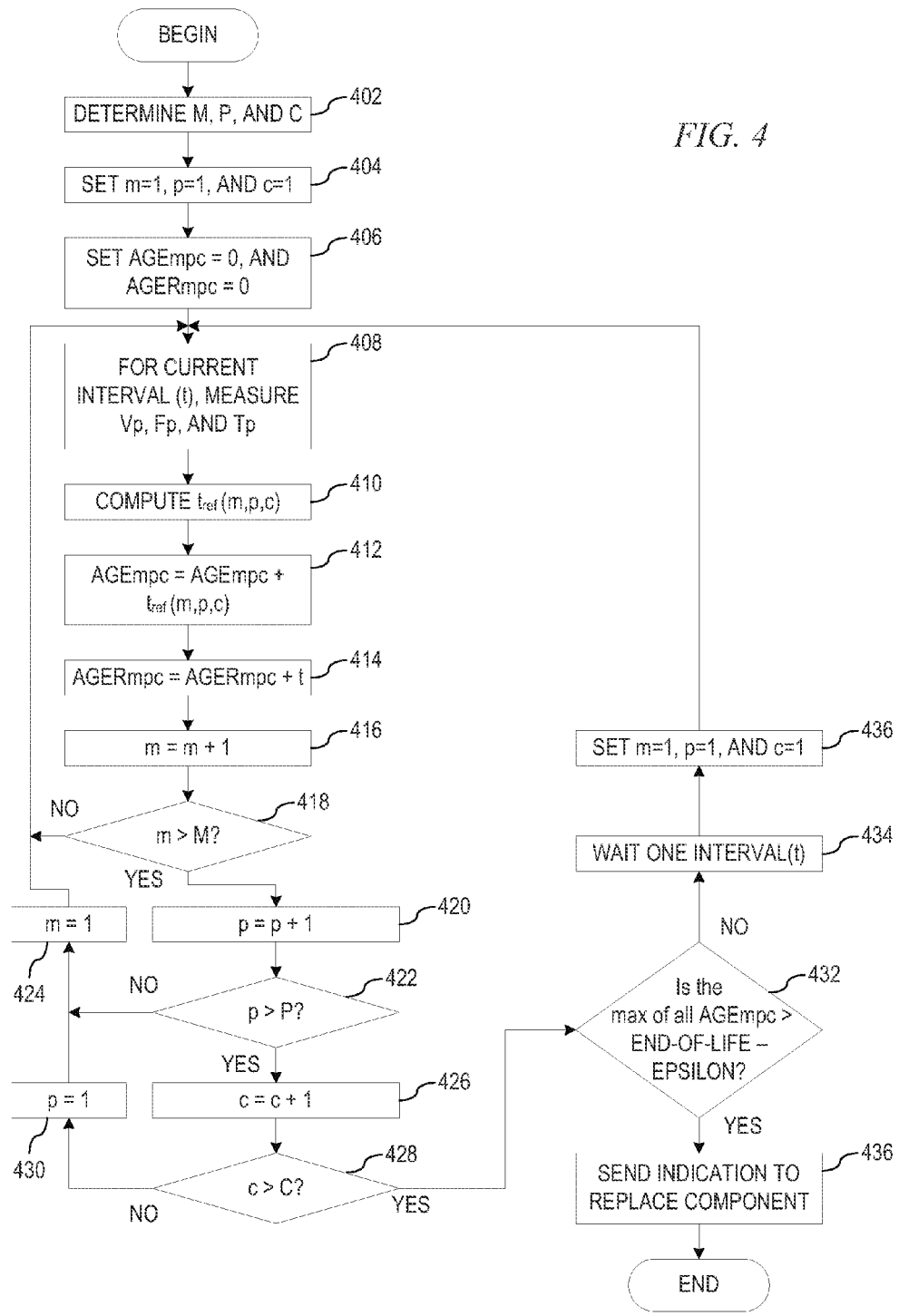
FIG. 4 depicts the operation performed in determining a modeled age of a core in a multi-core processor in accordance with an illustrative embodiment.

FIG. 4 depicts the operation performed in determining a modeled age of a core in a multi-core processor in accordance with an illustrative embodiment. As the operation begins, age determination logic, executed by a processor, determines a number of degradations (M), a number of voltage domains (P), and a number of cores (C) for the multi-core processor (step 402). The age determination logic then sets incrementing variables for degradations (m), voltage domains (v), and cores (c) to an initial value (step 404). The age determination logic also sets a set of modeled age variables AGEmpc equal to an initial value and a set of reference modeled age variables AGERmpc to an initial value (step 406). For each combination of degradation, voltage domain, and core, one AGEmpc value set to 0 and one AGERmpc value set to 0.

For each combination of degradation, voltage domain, and core during every interval (t), which is a predetermined time period, and starting with the current core in the number of cores (C), the age determination logic identifies a temperature for the current voltage domain (Tp), a frequency for the current voltage domain (Fp), and a voltage for the current voltage domain (Vp) (step 408). The age determination logic computes a time at a reference condition ($t_{ref}$) value (step 410) utilizing a hot carrier shift (HCI) degradation equation, a negative bias temperature instability (NBTI) or positive bias temperature instability (PBTI) degradation equation, a time dependent dielectric breakdown (TDDB) degradation equation, a PCCA (gate and contact) time dependent dielectric breakdown (TDDB) degradation equation, or the like.

With the time at a reference condition (GO determined, the age determination logic increases the modeled age variable AGEmpc value for the core by adding the $t_{ref}$ value to the current modeled age variable AGEmpc value (step 412) as follows:

$$AGEmpc = AGEmpc + t_{ref}(m,p,c).$$

The age determination logic also increases the reference modeled age variable AGERmpc value for the core by adding the interval (t) to the current reference modeled age variable AGERmpc value (step 414) as follows:

$$AGERmpc = AGERmpc + t.$$

The age determination logic then increases the degradation variable m by 1 (step 416) as follows:

$$m = m + 1,$$

to evaluate a model equation for the next degradation. The age determination logic then determines whether the current value of the degradation variable m is greater than the number of degradations (M) (step 418).

If at step 418 the age determination logic determines that the current value of the degradation variable m is less than or equal to the number of degradations (M), then the operation returns to step 408. If at step 418 the age determination logic determines that the current value of the degradation variable m is greater than the number of degradations (M), then the age determination logic increases the voltage domain variable p by 1 (step 420) as follows:

$$p = p + 1,$$

which moves to evaluate degradations associated with the next voltage domain. The age determination logic then determines whether the current value of the voltage domain variable p is greater than the number of voltage domains (P) (step 422). If at step 422 the age determination logic determines that the current value of the voltage domain variable p is less than or equal to the number of voltage domains (P), then the age determination logic sets the degradation variable m equal to the initial value (step 424), with the operation proceeding to step 410 thereafter.

If at step 422 the age determination logic determines that the current value of the voltage domain variable p is greater than the number of voltage domains (P), then the age determination logic increases the core variable c by 1 (step 426) as follows:

$$c = c + 1,$$

which changes to the next modeled core's degradations. The age determination logic then determines whether the current value of the core variable c is greater than the number of cores (C) (step 428). If at step 428 the age determination logic determines that the current value of the core variable c is less than or equal to the number of cores (C), then the age determination logic sets the voltage domain variable p equal to the initial value (step 430), with the operation proceeding to step 424 thereafter.

If at step 428 the age determination logic determines that the current value of the core variable c is greater than the number of cores (C), then the age determination logic determines, for all the cores, whether a maximum of the modeled age variable AGEmpc values for the cores on the multi-core processor is greater than an end-of-life value for the cores on the multi-core processor minus an epsilon value (step 432). That is, the manufacturer of the multi-core processor provides an end-of-life value for the cores on the multi-core processor. Additionally, enterprises provide a maintenance time frame (epsilon) for replacement of components within a data processing system. Thus, the age determination logic determines whether the modeled age variable AGEmpc value for the cores on the multi-core processor is greater than an end-of-life value for the cores on the multi-core processor minus the epsilon value.

If at step 432 the age determination logic determines that the maximum of the modeled age variable AGEmpc values for the cores on the multi-core processor is less than or equal to the end-of-life value for the cores on the multi-core processor minus the epsilon value, then the age determination logic waits one interval t (step 434) and then sets the voltage domain variable p equal to the initial value, sets the degradation variable m equal to the initial value, and sets the core variable c equal to the initial value (step 436), with the operation proceeding to step 408 thereafter. If at step 432 age determination logic determines that the maximum of the modeled age variable AGEmpc values for the cores on the multi-core processor is greater than the end-of-life value for the cores on the multi-core processor minus the epsilon value, the age determination logic sends an indication to an administrator that the multi-core processor requires replacing (step 436), with the operation terminating thereafter.

Figure 5:
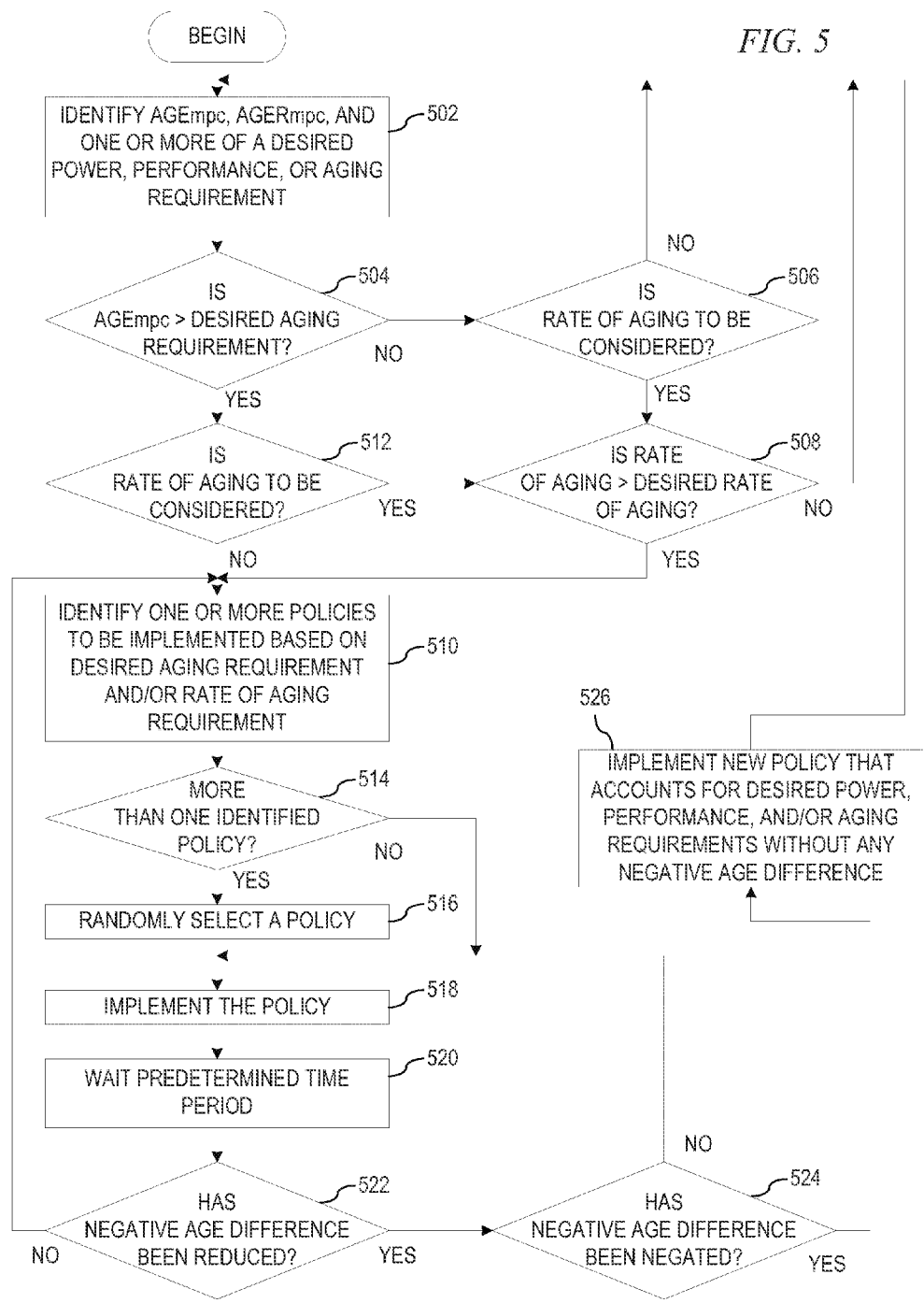
FIG. 5 depicts the operation performed in determining changes in one or more power management control parameters in order to mitigate aging of a set of components in a multi-core processor in accordance with an illustrative embodiment.

FIG. 5 depicts the operation performed in determining changes in one or more power management control parameters in order to mitigate aging of a set of components in a multi-core processor in accordance with an illustrative embodiment. As the operation begins, age management logic, executed by a processor, identifies a current modeled age value (AGEmpc), a reference modeled age value (AGERmpc), and one or more of a desired power, performance, or aging requirement (step 502). The age management logic then determines whether the set of components is aging faster than the desired aging requirement by comparing the current modeled age value (AGEmpc) to the desired aging requirement (step 504). If at step 504 the age management logic determines that aging rate is not faster than the desired aging requirement, then the age management logic determines whether a rate of aging is to be considered (step 506). If at step 506 the age management logic determines that that rate of aging is not to be considered, then the operation returns to step 502. If at step 506 the age management logic determines that that rate of aging is to be considered, then the age management logic determines whether the rate of aging is greater than a desired rate of aging (step 508). If at step 508 the age management logic determines whether the rate of aging is not greater than a desired rate of aging, then the operation returns to step 502. If at step the 508 the age management logic determines whether the rate of aging is greater than a desired rate of aging, then the age management logic identifies one or more policies to be implemented based on a desired aging along with, if required, one or more of a desired performance, a desired power usage, or a negative age difference (step 510).

If at step 504 the age management logic determines that the current modeled age value (AGEmpc) indicates that the core is aging at a rate that is faster than the desired aging requirement, then the age management logic determines whether a rate of aging is to be considered (step 512). If at step 512 the age management logic determines that the rate of aging is not to be considered, then the age management logic identifies one or more policies to be implemented based on a desired aging along with, if required, one or more of a desired performance, a desired power usage, or a negative age difference (step 510). If at step 512 the age management logic determines that the rate of aging is to be considered then the operation proceeds to step 508. However, in this instance, when coming from step 512, if at step 508 the age management logic determines whether the rate of aging is greater than a desired rate of aging, then the age management logic identifies one or more policies to be implemented based on a desired aging along with, if required, one or more of a desired performance, a desired power usage, or a negative age difference (step 510).

From step 510, the age management logic determines whether more than one policy has been identified (step 514). If at step 514 more than one policy has been identified, then the age management logic randomly selects one of the one or more policies to implement (step 516). From step 516 or if at step 514 only one policy has been identified, then the age management policy implements one or more corrective actions identified in the policy to mitigate the aging of the core in order to meet the desired aging requirements (step 518). The age management logic then waits a predetermined time period to allow the power management control parameters associated with that policy to take effect step 520). After the predetermined time period has expired, the age management logic determines whether the negative age difference has been reduced (step 522).

If at step 522 the age management logic determines that the negative age difference has not been reduced, then the process returns to step 510 to identify a new policy. If at step 522 the age management logic determines that the negative age difference has been reduced, then the age management logic determines whether the negative age difference has been negated (step 524). If at step 524 the age management logic determines the negative age difference has not been fully negated, then the operation returns to step 518. If at step 524 the age management logic determines that the negative age difference has been negated, then the age management logic implements a new policy that accounts for desired power, performance, and/or aging requirements without any negative age difference (step 526), with the operation returning to step 502 thereafter.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in act, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for monitoring and managing the aging of silicon in an integrated circuit device. The illustrative embodiments utilize modeling equations to evaluate various forms of silicon aging and/or degradation in real-time. Utilizing critical and measurable run-time operational parameters as input, such as voltage, frequency, temperature, switching, workloads, or the like on a fine time scale, the illustrative embodiments compute M degradations times P voltage domains (M*P) reference ages of N cores in a multi-core processor in real-time. The illustrative embodiments then implement one or more actions to manage the aging of the silicon that avoid early mortality of the silicon and improve the effective lifetime of the system. Further, once any of the M*P*N reference ages for the multi-core processor pass a predefined threshold associated with M degradations, P voltage domains, and N cores in a multi-core processor, respectively, the illustrative embodiments provide indications that the integrated circuit device should be replaced.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for determining a modeled age of a multi-core processor, the method comprising:

for each core in a set of cores in the multi-core processor executing in the data processing system, determining, by age determination logic executing in the data processing system, a temperature via temperature monitoring logic, a voltage via voltage monitoring logic, and a frequency via frequency monitoring logic at regular intervals for a set of degradations and a set of voltage domains, thereby forming the modeled age of the multi-core processor, wherein the temperature, the voltage, and the frequency are measurements of run-time operational characteristics experienced by each core of the set of cores and wherein forming the modeled age of the multi-core processor comprises:

for each degradation in the set of degradations, each voltage domain in the set of voltage domains, and each core in the set of cores, computing, by the age determination logic, a time at a reference condition ($t_{ref}$) value utilizing the determined temperature, voltage, and frequency of the current interval; and increasing, by the age determination logic, a current value for the modeled age of the multi-core processor by the $t_{ref}$ value;

determining, by the age determination logic, whether the modeled age of the multi-core processor is greater than an end-of-life value; and responsive to the modeled age of the multi-core processor being greater than end-of-life value, sending, by the age determination logic, an indication that the multi-core processor requires replacement.

2. The method of claim 1, further comprising:
responsive to the modeled age of the multi-core processor being less than or equal to the end-of-life value, repeating, by the age determination logic, the process to calculate a new modeled age of the multi-core processor; and
determining, by the age determination logic, whether the new modeled age of the multi-core processor is greater than an end-of-life value.

3. The method of claim 1, wherein the $t_{ref}$ value is computed utilizing, a negative bias temperature instability (NBTI) or positive bias temperature instability (PBTI) degradation equation, a time dependent dielectric breakdown (TDDB) degradation equation, or a PCCA (gate and contact) time dependent dielectric breakdown (TDDB) degradation equation.

4. The method of claim 1, wherein the set of degradations comprise at least two from a negative bias temperature instability (NBTI), a positive bias temperature instability (PBTI), hot carrier injection (HCI), a stress induced leakage current (SILC), or a time dependent dielectric breakdown (TDDB).

5. The method of claim 1, wherein the set of voltage domains comprises at least two different voltage domains.

6. The method of claim 1, wherein the set of cores is at least two cores.

7. A computer program product comprising a computer readable storage medium having a computer readable program stored therein, wherein the computer readable program, when executed on a computing device, causes the computing device to:
for each core in a set of cores in the multi-core processor executing in the computing device, determine, by age determination logic executing in the data processing system, a temperature via temperature monitoring logic, a voltage via voltage monitoring logic, and a frequency via frequency monitoring logic at regular intervals for a set of degradations and a set of voltage domains, thereby forming the modeled age of the multi-core processor, wherein the temperature, the voltage, and the frequency are measurements of run-time operational characteristics experienced by each core of the set of cores and wherein the computer readable program to form the modeled age of the multi-core processor further causes the computing device to:
for each degradation in the set of degradations, each voltage domain in the set of voltage domains, and each core in the set of cores, compute, by the age determination logic, a time at a reference condition ($t_{ref}$) value utilizing the determined temperature, voltage, and frequency of the current interval; and
increase, by the age determination logic, a current value for the modeled age of the multi-core processor by the $t_{ref}$ value;
determine, by the age determination logic, whether the modeled age of the multi-core processor is greater than an end-of-life value; and
responsive to the modeled age of the multi-core processor being greater than an end-of-life value, send, by the determination logic, an indication that the multi-core processor requires replacement.

8. The computer program product of claim 7, wherein the computer readable program further causes the computing device to:
responsive to the modeled age of the multi-core processor being less than or equal to the end-of-life value, repeat, by the age determination logic, the process to calculate a new modeled age of the multi-core processor; and
determine, by the age determination logic, whether the new modeled age of the multi-core processor is greater than an end-of-life value.

9. The computer program product of claim 7, wherein the $t_{ref}$ value is computed utilizing, a negative bias temperature instability (NBTI) or positive bias temperature instability (PBTI) degradation equation, a time dependent dielectric breakdown (TDDB) degradation equation, or a PCCA (gate and contact) time dependent dielectric breakdown (TDDB) degradation equation.

10. The computer program product of claim 7, wherein the set of degradations comprise at least two from a negative bias temperature instability (NBTI), a positive bias temperature instability (PBTI), hot carrier injection (HCI), a stress induced leakage current (SILC), or a time dependent dielectric breakdown (TDDB).

11. The computer program product of claim 7, wherein the set of voltage domains comprises at least two different voltage domains.

12. The computer program product of claim 7, wherein the set of cores is at least two cores.

13. An apparatus, comprising:
a processor; and
a memory coupled to the processor, wherein the memory comprises instructions which, when executed by the processor, cause the processor to:
for each core in a set of cores in the multi-core processor executing in the apparatus, determine, by age determination logic executing in the data processing system, a temperature via temperature monitoring logic, a voltage via voltage monitoring logic, and a frequency via frequency monitoring logic at regular intervals for a set of degradations and a set of voltage domains, thereby forming the modeled age of the multi-core processor, wherein the temperature, the voltage, and the frequency are measurements of run-time operational characteristics experienced by each core of the set of cores and wherein the instructions to form the modeled age of the multi-core processor further cause the processor to:
for each degradation in the set of degradations, each voltage domain in the set of voltage domains, and each core in the set of cores, compute, by the age determination logic, a time at a reference condition ($t_{ref}$) value utilizing the determined temperature, voltage, and frequency of the current interval; and
increase, by the age determination logic, a current value for the modeled age of the multi-core processor by the $t_{ref}$ value;
determine, by the age determination logic, whether the modeled age of the multi-core processor is greater than an end-of-life value; and
responsive to the modeled age of the multi-core processor being greater than an end-of-life value, send, by the age determination logic, an indication that the multi-core processor requires replacement.

14. The apparatus of claim 13, wherein the instructions further cause the processor to:
responsive to the modeled age of the multi-core processor being less than or equal to the end-of-life value, repeat, by the age determination logic, the process to calculate a new modeled age of the multi-core processor; and
determine, by the age determination logic, whether the new modeled age of the multi-core processor is greater than an end-of-life value.

15. The apparatus of claim 13, wherein the $t_{ref}$ value is computed utilizing, a negative bias temperature instability (NBTI) or positive bias temperature instability (PBTI) degradation equation, a time dependent dielectric breakdown (TDDB) degradation equation, or a PCCA (gate and contact) time dependent dielectric breakdown (TDDB) degradation equation.

16. The apparatus of claim 13, wherein the set of degradations comprise at least two from a negative bias temperature instability (NBTI), a positive bias temperature instability (PBTI), hot carrier injection (HCI), a stress induced leakage current (SILC), or a time dependent dielectric breakdown (TDDB).

17. The apparatus of claim 13, wherein the set of voltage domains comprises at least two different voltage domains.

18. The apparatus of claim 13, wherein the set of cores is at least two cores.

\* \* \* \* \*